United States Patent
Kim et al.

(10) Patent No.: US 8,021,993 B2
(45) Date of Patent: Sep. 20, 2011

(54) METHOD OF CARRYING OUT AN EXPOSURE PROCESS FOR A LIQUID CRYSTAL DISPLAY DEVICE

(75) Inventors: Yong Hun Kim, Paju-si (KR); Sang Min Kwak, Hwaseong-si (KR); Jin Woo Seo, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 944 days.

(21) Appl. No.: 11/315,063

(22) Filed: Dec. 22, 2005

(65) Prior Publication Data

US 2006/0183351 A1    Aug. 17, 2006

(30) Foreign Application Priority Data

Dec. 22, 2004 (KR) .......................... 10-2004-110197

(51) Int. Cl.
*H01L 21/00* (2006.01)
(52) U.S. Cl. ......... 438/795; 438/942; 438/949; 414/940
(58) Field of Classification Search .................. 438/795, 438/942, 948, 949; 414/940; 396/611; 118/52, 118/666
See application file for complete search history.

(56) References Cited

U.S. PATENT DOCUMENTS

| | | | |
|---|---|---|---|
| 6,159,541 A * | 12/2000 | Sakai et al. | 427/240 |
| 6,253,118 B1 | 6/2001 | Koyama | |
| 6,402,401 B1 * | 6/2002 | Ueda et al. | 396/611 |

FOREIGN PATENT DOCUMENTS

| | | |
|---|---|---|
| CN | 1426087 | 6/2003 |
| JP | 61-059837 | 3/1986 |
| JP | 07-185481 | 7/1995 |
| JP | 2001-077014 | 3/2001 |
| JP | 2002-162163 | 6/2002 |
| TW | 408368 | 10/2000 |

OTHER PUBLICATIONS

First Office Action issued in corresponding Chinese Patent Application No. 2005101321829; issued Apr. 4, 2008.
Office Action issued in corresponding Taiwanese Patent Application No. 094145273; issued Apr. 17, 2009.

* cited by examiner

*Primary Examiner* — Khiem D Nguyen
(74) *Attorney, Agent, or Firm* — Brinks Hofer Gilson & Lione

(57) ABSTRACT

An apparatus for manufacturing a liquid crystal display device is disclosed. A first robot arm at a loading side of the thru-conveyor receives a substrate coated with photoresist and conveys the substrate to a thru-conveyor. A softbake hot plate (SHP) at the unloading side of the thru-conveyor removes solvent from the substrate. A cool plate lowers the substrate temperature from which the solvent is removed. A buffer temporarily stores the substrate having the lowered temperature. A second robot arm between the thru-conveyor, the SHP, the cool plate and a loading side of the buffer, loads/unloads the substrate. A temperature control unit adjusts the substrate temperature unloaded from the buffer. A third robot arm between the unloading side of the buffer, the temperature control unit and an exposure unit that exposes the substrate, loads/unloads the substrate.

2 Claims, 3 Drawing Sheets

METHOD OF CARRYING OUT AN EXPOSURE PROCESS FOR A LIQUID CRYSTAL DISPLAY DEVICE

This application claims the benefit of Korean Patent Application No. P2004-110197, filed on Dec. 22, 2004, which is hereby incorporated by reference as if fully set forth herein.

TECHNICAL FIELD

The present application relates to an apparatus and method for manufacturing a liquid crystal display device, and more particularly, to an exposure layout for applying an exposure process to a substrate of a display device such as a liquid crystal display device.

BACKGROUND

Generally, an exposure unit of an apparatus for manufacturing a liquid crystal display device is provided to perform an exposure process by applying ultraviolet radiation to a glass substrate coated with ph otoresist after providing a photomask having a predetermined pattern. Before performing the exposure process, the glass substrate is unloaded from a coating unit for coating the photoresist. At this time, there are a plurality of robot arms and conveyors between the coating unit and the exposure unit for conveying the substrate.

FIG. 1 is a block diagram of an exposure layout according to the related art. The exposure layout explains a sequential process for conveying the glass substrate to the exposure unit.

As shown in FIG. 1, a related art exposure layout is provided with thru-conveyors 11 and 12, a solvent removing unit 20, a temperature reduction unit 30, an in-out turn unit 40, a titler 50, a buffer 60 and a plurality of robot arms 71, 72 and 73.

The thru-conveyor 11 is provided to load a substrate, and the thru-conveyor 12 is provided to unload the substrate.

Then, the substrate coated with photoresist by a coater 2 is conveyed to the solvent removing unit 20 from the thru-conveyor 11. The solvent removing unit 20 removes solvent from the substrate coated with photoresist. The solvent removing unit 20 is formed of an oven having a softbake hot plate SHP. The temperature reduction unit 30 is formed of a cool plate CP for reducing a temperature of the substrate unloaded from the SHP 20. The in-out turn unit 40 changes the progressing direction of the substrate so as to provide the substrate to the next process.

The robot arms 71, 72 and 73 are positioned between each of the components for loading and unloading the substrate. The robot arms include the first robot arm 71, the second robot arm 72 and the third robot arm 73.

The first robot arm 71 receives the substrate coated with photoresist from the coater 2, and then conveys the substrate to the thru-conveyor 11. The first robot arm 71 is provided between the coater 2 and the substrate loading side of the thru-conveyor 11.

The second robot arm 72 receives the substrate unloaded from the thru-conveyor 11, and then conveys the substrate to the SHP 20. Also, the second robot arm 72 receives the substrate from the SHP 20, and then conveys the substrate to the temperature reduction unit 30. Further, the second robot arm 72 receives the substrate from the temperature reduction unit 30, and then conveys the substrate to the in-out turn unit 40.

The SHP 20 is positioned at the substrate unloading side of the thru-conveyor 11. The second robot arm 72 is positioned among the SHP 20, the temperature reduction unit 30 and the in-out turn unit 40, for conveying the substrate to the respective components 20; 30 and 40.

The third robot arm 73 receives the substrate from the in-out turn unit 40, and then conveys the substrate to the exposure unit 3. After completing the exposure process, the substrate is conveyed to the in-out turn unit 40 by the third robot arm 73.

The third robot arm 73 is positioned among the titler 50, the buffer 60, the exposure unit 3 and the in-out turn unit 40, for selectively conveying the substrate to the respective components 50, 60, 3 and 40.

Before performing the exposure process, the substrate is conveyed to the titler 50 by the third robot arm 73 for forming an identification code ID for each substrate.

The buffer 60 includes a cassette for temporarily storing the substrate before being conveyed to the next process. That is, the substrate having the identification code ID is conveyed to the buffer 60 by the third robot arm 73 to be stored temporarily before the exposure unit 3.

Reference number 4 is a vacuum dry unit VCD for drying a coating layer of the substrate unloaded from the coater 2 under low vacuum conditions. The VCD 4 and the SHP 20 are positioned parallel to the thru-conveyor 11.

A method for performing the exposure process on the substrate according to the related art exposure layout may be explained as follows.

First, after coating the substrate with photoresist by the coater 2, the substrate is conveyed to the VCD 4 by the first robot arm 71. After completing the curing process of the substrate in the VCD 4, the substrate is conveyed to the thru-conveyor 11 by the first robot arm 71 (S1).

The second robot arm 72 receives the substrate from the thru-conveyer 11, and then conveys the substrate to the SHP 20 (S2). The SHP 20 removes the solvent from the substrate.

After removing the solvent from the substrate, the substrate is unloaded from the SHP 20 (S3), and then the substrate is conveyed to the temperature reduction unit 30 by the second robot arm 72. After reducing the temperature of the substrate by the temperature reduction unit 30, the substrate is unloaded from the temperature reduction unit 30 (S4), and then is conveyed to the in-out turn unit 40 by the second robot arm 72 (S5).

At this point, the in-out turn unit 40 changes the direction of the substrate conveyed by the second robot arm 72. Then, the third robot arm 73 receives the substrate, which has had its direction changed by the in-out turn unit 40 (S6), and conveys the substrate to the titler 50.

The titler 50 forms the ID for each substrate. Then, the substrate having the ID is unloaded from the titler 50 (S7) and is conveyed to the exposure unit 3 (S9) by the third robot arm 73.

If the exposure unit 3 is in an operation mode, the third robot arm 73 conveys the substrate to the buffer 60 so that the substrate may be temporarily stored in the buffer 60.

After completing the exposure process of the substrate, the substrate unloaded from the exposure unit is conveyed to the in-out turn unit 40 by the third robot arm 73 (S10), and also is conveyed to the thru-conveyor 12 (S11).

In the exposure layout according to the related art, even though the temperature reduction unit is provided so as to adjust the temperature of the substrate before loading the substrate to the exposure unit 3, it is difficult to maintain the most appropriate temperature for each substrate.

The adjustment of the temperature of the substrate by an additional chamber 5 affects the entire exposure layout, or a portion of the layout, including the in-out turn unit 40, the third robot arm 73 and the buffer 60. As a result, it is difficult to adjust precisely the temperature of each substrate.

If the substrate does not have the precise temperature before the exposure process, the dimensions of the substrate may be changed due to the temperature difference. As a result, the position for exposure may be incorrect, and consequently the product may be defective.

Also, the third robot arm 73 performs eight conveyances for the substrate each cycle. Accordingly, a tact time for each cycle is high.

To decrease the tact time for each cycle, another layout for providing an additional robot arm has been proposed. In this case, it is necessary to provide a space for the additional robot arm, and thus the problem of an increased footprint (length of the entire layout) arises. Further, it requires an increase in plant size for the exposure layout.

SUMMARY

An exposure layout of an apparatus for manufacturing a liquid crystal display device that may substantially obviate one or more problems due to limitations and disadvantages of the related art is described herein. The exposure layout may provide a proper temperature of a substrate in an exposure process, decrease a tact time, and minimize a footprint.

An apparatus and method for manufacturing a liquid crystal display device are disclosed. The apparatus includes a thru-conveyor for conveying a substrate, a first robot arm, and a second robot arm. The first robot arm receives the substrate coated with photoresist and conveys the substrate to the thru-conveyor. A hot plate removes solvent from the substrate. A cool plate lowers a temperature of the substrate from which the solvent is removed. A buffer temporarily stores the substrate having the lowered temperature. A second robot arm is arranged among the thru-conveyor, the hot plate, the cool plate and a substrate loading side of the buffer, for loading and/or unloading the substrate. A temperature control unit adjusts a temperature of the substrate unloaded from the buffer. An exposure unit and a third robot arm are arranged among a substrate unloading side of the buffer, the temperature control unit and the exposure unit, for loading and/or unloading the substrate.

It is to be understood that both the foregoing general description and the following detailed description of the present invention are exemplary and explanatory and are intended to provide further explanation of the invention as claimed.

DETAILED DESCRIPTION

Reference will now be made in detail to preferred embodiments of the exposure layout, examples of which are illustrated in the accompanying drawings. Wherever possible, the same reference numbers will be used throughout the drawings to refer to the same or like parts.

Hereinafter, an apparatus for manufacturing a liquid crystal display device will be described with reference to the accompanying drawings.

Figure 1:
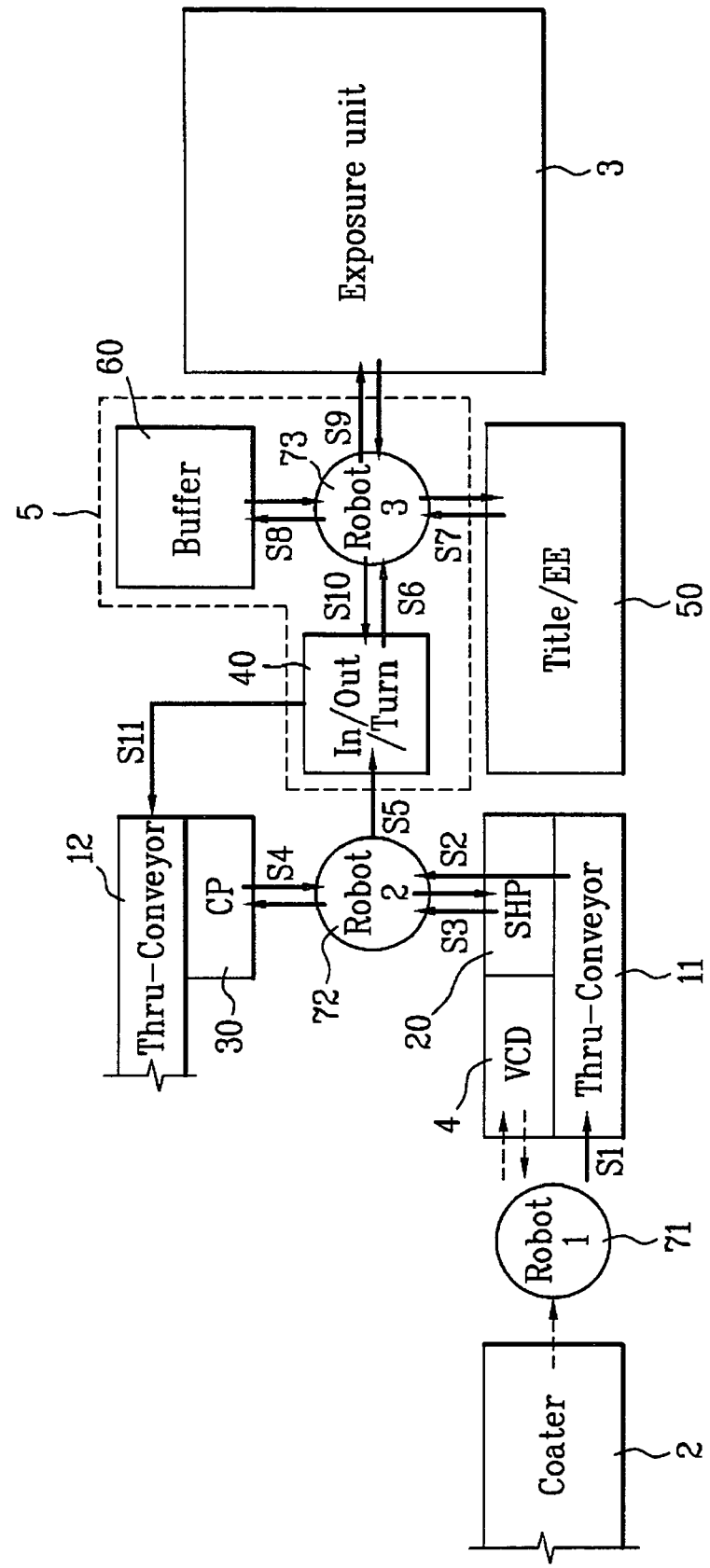
FIG. 1 is a block diagram of an exposure layout according to the related art.
Figure 2:
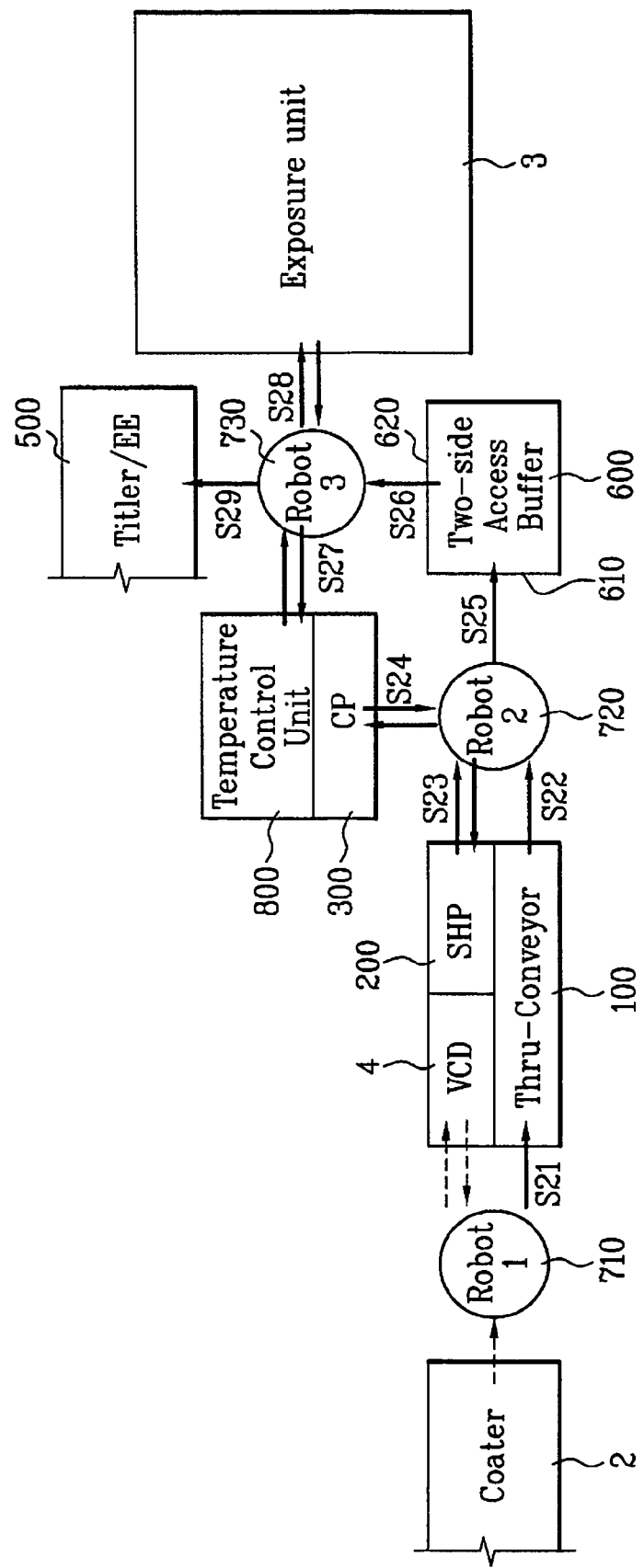
FIG. 2 is a block diagram of an exposure layout according to the first embodiment.

FIG. 2 is a block diagram of an exposure layout according to the first embodiment.

As shown in FIG. 2, an exposure layout according to the first embodiment may include a thru-conveyor 100, a first robot arm 710, a second robot arm 720, a third robot arm 730, a hot plate (solvent removing unit) referred to as a softbake hot plate (SHP) 200, a cool plate 300, a buffer 600, a temperature control unit 800, and an exposure unit 3.

The thru-conveyor 100 may convey a substrate coated with photoresist. Also, the first robot arm 710, the second robot arm 720 and the third robot arm 730 may load and/or unload the substrate. The SHP 200 may remove solvent from the substrate coated with photoresist. Then, the cool plate 300 may receive the substrate from which the solvent is removed, and lowers the temperature of the substrate. After that, the buffer 600 may temporarily store the substrate having the lowered temperature before applying the exposure process to the substrate.

In case of the related art, only one side of the buffer may be used for loading and unloading the substrate. However, in case of the present exposure layout, the buffer 600 may have a substrate loading side 610 and a substrate unloading side 620 positioned separately. In particular, the substrate loading side 610 of the buffer 600 may be positioned perpendicular to the substrate unloading side 620 of the buffer 600.

The temperature control unit 800 may receive the substrate from the buffer 600 and adjust the temperature of the substrate to the exposure process. The temperature control unit 800 may control the temperature of the substrate immediately before applying the exposure process to the substrate. Accordingly, it may be possible to perform a precise exposure process and to prevent a defective exposure caused by deformation of the substrate.

After providing a photo-mask having a predetermined pattern over the substrate coated with photoresist, the exposure unit 3 may apply ultraviolet radiation to the substrate.

The arrangement of the components in the exposure layout according to the first embodiment will now be described in detail.

First, the first robot arm 710 may be provided at the substrate loading side of the thru-conveyor 100. The SHP 200 may be provided at the substrate unloading side of the thru-conveyor 100.

From a plan view perspective, the SHP 200 and the thru-conveyor 100 may be positioned in two parallel rows. That is, as shown in FIG. 2, the SHP 200 may be positioned on the substrate unloading side of the thru-conveyor 100. Also, a vacuum dry unit VCD (curing unit) 4 may be positioned in front of the SHP 200 along the process direction.

After a coating layer is formed on the substrate in a coater 2, the VCD 4 may dry and cure the coating layer of the substrate unloaded from the coater 2 under low vacuum conditions.

The second robot arm 720 may be positioned behind the thru-conveyor 100 and the SHP 200. Also, the CP 300 may be positioned over the second robot arm 720, from a plan view perspective.

The temperature control unit 800 and the CP 300 may be positioned in two parallel rows.

The third robot arm 730 may be positioned among the substrate unloading side 620 of the buffer 600, the temperature control unit 800 and the exposure unit 3.

In particular, from a plan view perspective, the first robot arm 710, the thru-conveyor 100, the second robot arm 720 and the buffer 600 may be sequentially positioned along one line. Also, the temperature control unit 800, the third robot arm 730 and the exposure unit 3 may be sequentially positioned along one line. From a plan view perspective, the third robot arm 730 may be positioned over the buffer 600. The substrate loading side 610 of the buffer 600 may be opposite to the second robot arm 720, and the substrate unloading side 620 of the buffer 600 may be opposite to the third robot arm 730.

In addition, from a plan view perspective, a titler 500 may be positioned over the third robot arm 730. That is, the titler 500, the third robot arm 730 and the buffer 600 may be sequentially positioned along the same vertical line.

In the exposure layout according to the first embodiment, the titler 500 may be provided in a location appropriate for conveying the substrate to the next process after completing the exposure process.

A method for performing the exposure process in the exposure layout according to the first embodiment may be explained as follows.

After the substrate is coated with photoresist in the coater 2, the substrate may be conveyed by the first robot arm 710. The first robot arm 710 may convey the substrate coated with photoresist to the VCD 4. After completing the curing of the substrate, the substrate may be conveyed to the thru-conveyor 100 by the first robot arm 710 (S21).

Then, the substrate unloaded from the thru-conveyor 100 may be conveyed to the SHP 200 by the second robot arm 720 (S22). The SHP 200 may remove the solvent from the substrate. Then, the substrate may be unloaded from the SHP 200 (S23), and the substrate may be conveyed to the CP 300 by the second robot arm 720. After the temperature of the substrate is lowered in the CP 300, the substrate may be unloaded from the CP 300 (S24), and the substrate may be conveyed to the buffer 600 by the second robot arm 720 (S25).

The substrate may be temporarily stored in the buffer 600 and then unloaded from the buffer 600 (S26), and then conveyed to the temperature control unit 800 by the third robot arm 730 (S27). At this time, the temperature control unit 800 may properly adjust the temperature of the substrate for the exposure process.

After adjusting the temperature of the substrate in the temperature control unit 800, the substrate may be unloaded from the temperature control unit 800 by the third robot arm 730, and then the substrate may be conveyed to the exposure unit 3 by the third robot arm 730 (S28). After completing the exposure process, the substrate may be loaded to the titler 500. Then, after the substrate is unloaded from the tilter 500 (S29), the substrate may be conveyed to the next process.

If the exposure unit 3 is in operation mode, the third robot arm 730 may stop the unloading of the substrate. If the exposure process is finished, the third robot arm 730 may resume unloading the substrate from the buffer 600.

The components for the exposure layout may be arranged differently.

That is, another exposure layout having a different arrangement of a buffer 700, a CP 300 and a temperature control unit 800 may be provided.

Figure 3:
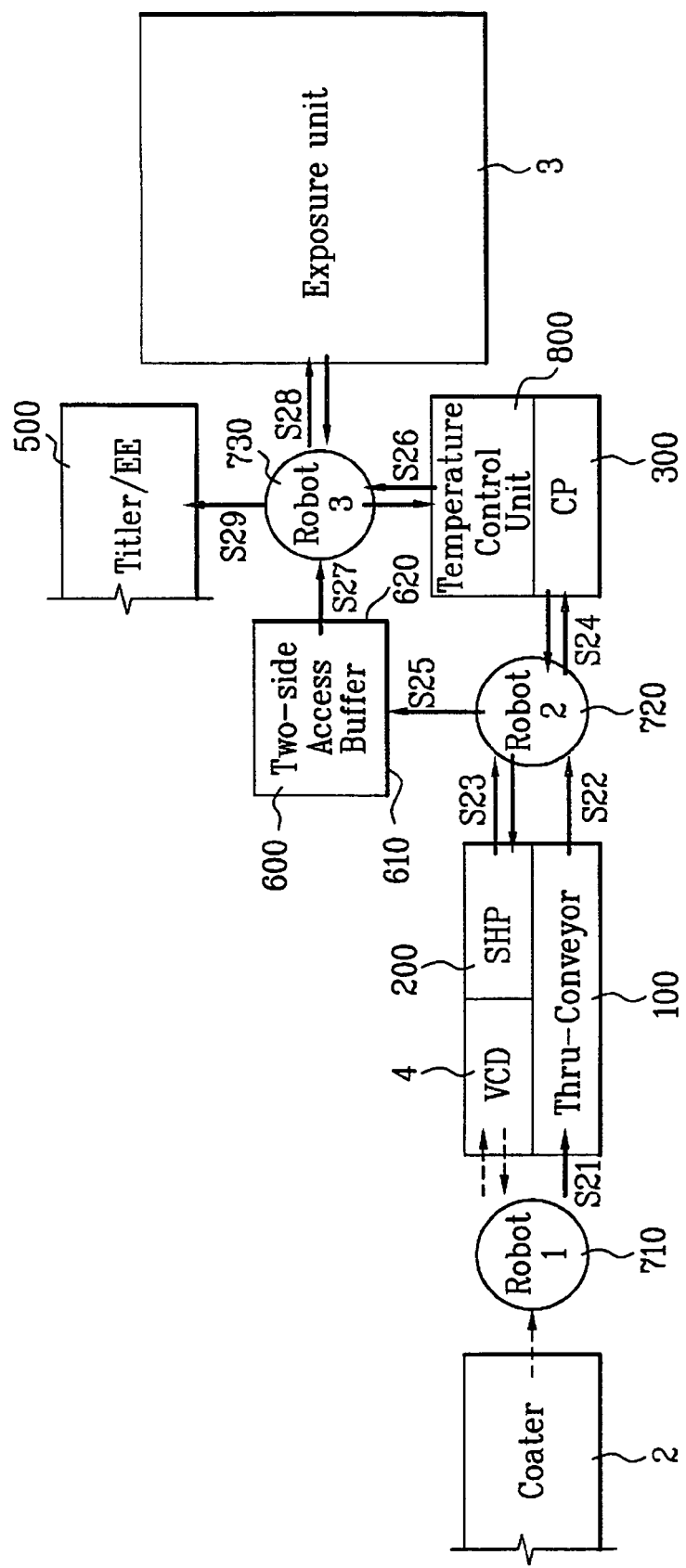
FIG. 3 is a block diagram of an exposure layout according to the second embodiment.

FIG. 3 is a block diagram of an exposure layout according to the second embodiment.

In the exposure layout according to the second embodiment, as shown in FIG. 3, a first robot arm 710, a thru-conveyor 100, a second robot arm 720 and the CP 300 may be sequentially arranged along one line, from a plan view perspective. Also, the temperature control unit 800 and the CP 300 may be provided in two parallel rows. Also, the buffer 600, a third robot arm 730 and an exposure unit 3 may be sequentially arranged along one line. From a plan view perspective, the temperature control unit 800 and the third robot arm 730 may be arranged along the same vertical line. That is, from a plan view perspective, the third robot arm 730 may be positioned over the temperature control unit 800. The buffer 600 and the second robot arm 720 may be arranged along the same line. That is, from a plan view perspective, the buffer 600 may be positioned over the second robot arm 720.

A method for performing the exposure process in the exposure layout according to the second embodiment is substantially the same as the method for performing the exposure process in the exposure layout according to the first embodiment.

The exposure layout according to the preferred embodiments may have the following advantages.

In the exposure layout according to a preferred embodiment, the temperature of the substrate may be adjusted before loading the substrate into the exposure unit. Accordingly, it may be possible to minimize the incidence of defective exposures of the substrate.

In particular, the third robot arm may perform six conveyances for the substrate each cycle. That is, it may be possible to decrease a tact time for each cycle without providing an additional robot arm.

Also, the buffer has the substrate loading side and the substrate unloading side positioned in different directions. As a result, it may be possible to minimize the footprint or length of the entire layout.

It will be apparent to those skilled in the art that various modifications and variations can be made in the present invention without departing from the spirit or scope of the invention. Thus, it is intended that the present application covers the modifications and variations of this invention, provided that they come within the scope of the appended claims and their equivalents.

What is claimed is:

1. A method of carrying out an exposure process for a liquid crystal display device comprising:
    conveying a substrate coated with photoresist to a thru-conveyor using a first robot arm;
    unloading the substrate from the thru-conveyor and conveying the substrate to a hot plate using a second robot arm;
    removing solvent from the substrate at the hot plate;
    after removing solvent, conveying the substrate to a cold plate using the second robot arm;
    lowering a temperature of the substrate at the cold plate;
    after lowering the temperature, conveying the substrate to a buffer using the second robot arm;
    temporarily storing the substrate in the buffer;
    after storing, conveying the substrate to a temperature control unit by a third robot arm;
    adjusting the temperature of the substrate in the temperature control unit;
    after adjusting the temperature, conveying the substrate to the exposure unit using the third robot arm;
    exposing the substrate to ultraviolet radiation in the exposure unit.

2. The method of claim 1, further comprising, after exposing the substrate to ultraviolet radiation, conveying the substrate to a titler using the third robot arm.

* * * * *